United States Patent [19]

Stein, Karl-Ulrich

[11] Patent Number: 4,851,695
[45] Date of Patent: Jul. 25, 1989

[54] OPTOELECTRONIC COUPLING ELEMENT WITH TRANSPARENT SPACER ELEMENTS

[75] Inventor: Stein, Karl-Ulrich, Unterhaching,, Fed. Rep. of Germany

[73] Assignee: Siemens Aktiengesellschaft, Berlin and Munich, Fed. Rep. of Germany

[21] Appl. No.: 95,377

[22] Filed: Sep. 10, 1987

[30] Foreign Application Priority Data

Sep. 30, 1986 [DE] Fed. Rep. of Germany ....... 3633251

[51] Int. Cl.$^4$ ............................................. G02B 27/00
[52] U.S. Cl. ..................................... 250/551; 357/19
[58] Field of Search ....................... 250/551, 227, 239; 357/19; 307/311

[56] References Cited

U.S. PATENT DOCUMENTS

| | | | |
|---|---|---|---|
| 3,229,104 | 1/1966 | Rutz | 250/211 |
| 3,938,173 | 2/1976 | Jackson et al. | 357/19 |
| 4,100,562 | 7/1978 | Sugawara et al. | 250/551 |
| 4,412,135 | 10/1983 | Awaji | 250/551 |
| 4,446,375 | 5/1984 | Aird | 250/551 |
| 4,533,833 | 8/1985 | Copeland et al. | 250/551 |
| 4,588,261 | 5/1986 | Erhardt | 550/167 |
| 4,719,358 | 1/1988 | Matsumoto et al. | 250/551 |

FOREIGN PATENT DOCUMENTS 0150929 8/1985 European Pat. Off. .

OTHER PUBLICATIONS

Patent Abstracts of Japan, vol. 7, No. 119, 5/24/83, No. 58-37977.
Patent Abstracts of Japan, vol. 7, No. 80, 4/2/83, No. 58-7886.
Patent Abstracts of Japan, vol. 8, No. 221, 10/9/84, No. 58-103387.

*Primary Examiner*—David C. Nelms
*Attorney, Agent, or Firm*—John Francis Moran

[57] ABSTRACT

An optoelectronic coupling element with a light-emitting semiconductor component (1), in particular a transmitter chip, and a light-receiving semiconductor component (2), in particular a receiver chip, are firmly joined together via an optic coupling medium (3). The construction of this compact coupling element is to require relatively little expense and thus to be cost-effective. To this end the invention provides that the light-emitting semiconductor component (1) and the light-receiving semiconductor component (2) are connected together directly through the coupling medium (3), and that the coupling medium (3) is a transparent adhesive or glass solder compound. The optoelectronic coupling element disclosed is highly suitable for use as an optocoupler for signal transmission.

8 Claims, 1 Drawing Sheet

OPTOELECTRONIC COUPLING ELEMENT WITH TRANSPARENT SPACER ELEMENTS

BACKGROUND OF THE INVENTION

This invention relates to optoelectronic couplers, and, it relates, more particularly, to such couplers wherein the transmitter and detectors are in a stacked arrangement joined together by the optical coupling medium.

An optoelectronic coupling element or optocoupler, known and referred to as an optoisolator or optoelectronic relay, respectively, serves, to provide a device for feedback free signal transmission between two electrically separated circuits, namely a primary and a secondary circuit. Such devices typically include a luminescence diode, namely a diode that is light-emitting in the visible or infrared wavelength range (LED or IRED type), and a detector, for example a photodiode or phototransistor which are coupled together optically. The advantages of optocouplers over mechanical relays are the absence of any moving parts, their long life, small size, compatibility with semiconductor circuits, and above all their high switching frequency.

In optocouplers, the luminescence diode and photodetector are usually mounted on separator conductor areas and arranged so that as large as possible a portion of the emission radiation falls on the receiver surface of the photodetector. The optical coupling can be improved by an intermediate layer of synthetic material which brings about at the same time a stronger electric insulation.

In present conventional optocouplers, typical construction utilizes a conductive tape for the primary and secondary sides on which the transmitter and receiver chips, respectively, are applied and contacted by the usual methods. The two tapes are brought together. The light channel is produced by dabbling, cladding or sealing. Thereafter the light channel is coated with a reflecting layer and the entire component is clad or coated externally with plastic and completed. Instead of two conductor tapes, which permit the transmitter and receiver chips to be constructed opposite each other, it is also possible to use a single conductor tape method with coplanar construction of the transmitter and receiver chips.

Due to the complex design of an optoelectronic coupling element with e.g. an infrared transmitter chip, an insulating light transmission path (coupling medium) and a receiver chip, this construction is relatively costly.

SUMMARY OF THE INVENTION

It is an object of the present invention to provide an optoelectronic coupling element, the construction of which requires relatively little expense and is thus cost-effective and which also requires little space.

According to the invention, this problem is solved by an optoelectronic coupling element wherein a transmitter chip and a receiver chip are secured together by an optical coupling medium comprising a transparent adhesive or a glass solder compound.

In some of the further aspects of the invention, transparent spacer particles are added to the optical coupling medium. The spacer particles are in the form of glass fiber segments or glass balls and the dimensions of these spacer particles determine the displacement between the two chips.

The advantages achieved with the invention consist in particular in that the construction of the proposed optoelectronic coupling element is very simple and feasible with conventional devices.

The light channel (coupling medium) between the transmitter and receiver chips can be produced in a simple and cost-effective manner by a procedure almost identical with the conventional chip gluing method, in particular if the requirements of blocking voltage between the primary and secondary sides are low.

Of special advantage is the addition of transparent spacer particles, preferably glass fiber segments or glass balls, to the coupling medium consisting of an adhesive or glass solder. Thereby, for one thing, higher blocking voltage demands can be realized. For another, well defined distances between the optoelectronic components to be connected are ensured with this measure.

This advantage can be achieved also by providing the semiconductor component, designed as transmitter or receiver chip, on its side adjacent to the transparent adhesive or glass solder union provided as optical coupling medium with an insulating substrate, e.g. with chromium-doped GaAs, and/or the light-receiving semicomponent element designed as receiver chip on its corresponding side with an additional insulating layer, e.g. of polyimide.

BRIEF DESCSRIPTION OF THE DRAWING

The invention will be explained more specifically with reference to a preferred embodiment illustrated purely schematically in the figures of the drawing. Parts which do not necessarily contribute to comprehension of the invention are not labeled in the figures or are omitted.

FIG. 1 depicts an illustrative optoelectronic coupling element in accordance with the invention, shown in cross-sectional form.

FIG. 2 a top view of the optoelectronic coupling element of FIG. 1.

DETAILED DESCRIPTION

Figure 1:
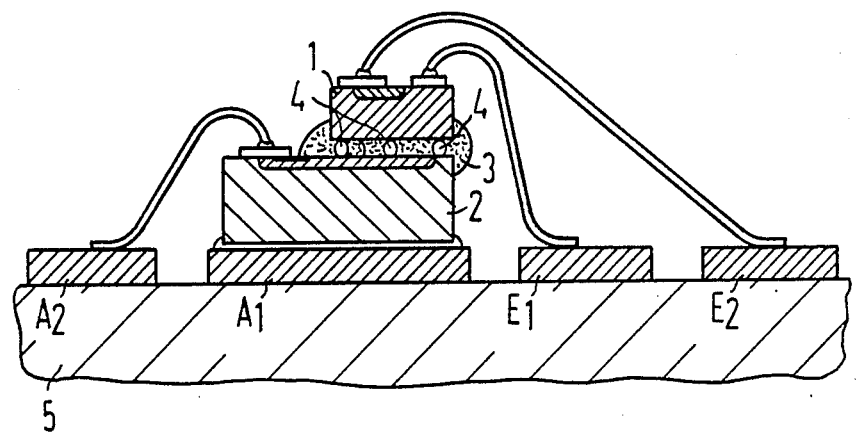
Figure 2:
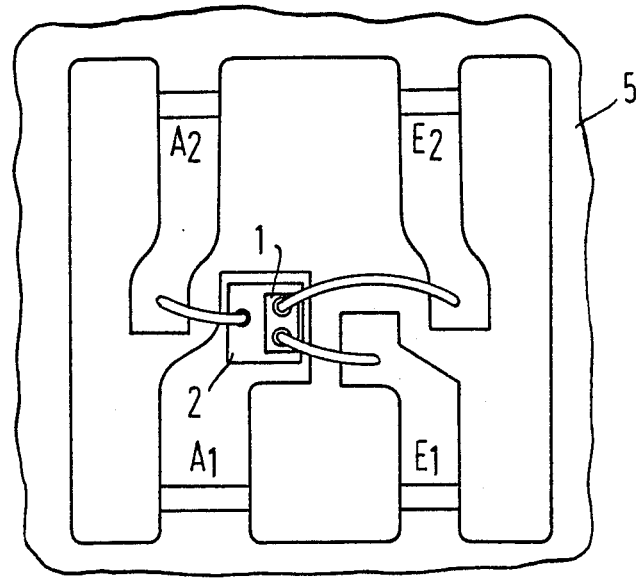

The optoelectronic coupling element illustrated in FIGS. 1 and 2 essentially includes the light-emitting semiconductor component 1, in this example a transparent infrared transmitter chip (e.g. GaAs having a diffused diode at the surface) and the light-receiving semiconductor component 2, in this example an infrared receiver chip (phototransistor), which are connected together directly through the transparent coupling medium 3, in this example an adhesive. To this coupling medium 3, which may expediently comprise alternatively of glass solder, preferably transparent spacer particles 4 are added. Especially suitable as spacer particles 4 are for example glass balls or glass fiber segments.

For assembling the optoelectronic coupling element the following procedure is expedient;

The infrared transmitter chip 1 is glued with the adhesive 3 mixed with spacer particles 4 directly on the infrared receiver chip 2. Bonding the receiver chip 2 to the conductor tape and contacting the chip surfaces of the receiver and transmitter is done by conventional chip gluing or wiring. $E_1$ and $A_1$, respectively, are the input and output of the transmitter chip 1, and $E_2$ and $A_2$, respectively, are the input and output of the receiver chip 2, which are applied in conventional manner on a metal spider, the so-called lead frame 5. Applying the transmitter chip 1 with the transparent adhesive may also be done by the usual chip gluing methods.

The construction is preferably performed in the sequence: System support (conductor tape) 5, connecting medium (e.g. eutectic), large-area receiver chip 2, coupling medium 3, small-area transmitter chip 1.

The outer component envelope is effected with a conventional enveloping material which is not transparent and is stained to be reflecting (white).

There has thus been shown and described a novel optoelectronic coupling element which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. An optoelectronic coupling element comprising: a light-emitting semiconductor component in the form of a light-emitting semiconductor chip, and a light-receiving semiconductor component in the form of a receiver chip, an optical coupling medium providing the sole means for mechanically securing one of the chips to the other of the chips, the optical coupling medium is selected from the group consisting of a transparent adhesive and glass solder compound for directly joining together the light-emitting semiconductor chip and the light-receiving semiconductor chip, and transparent spacer particles are included in the coupling medium between the light-emitting chip and the light-receiving chip to serve as spacers for electrical isolation purposes.

2. An optoelectronic coupling element according to claim 1, wherein the spacer particles are selected from the group consisting of glass fiber segments and glass balls.

3. An optoelectronic coupling element according to claim 1, wherein the dimensions of the spacer particles determine the given distance between the light-emitting semiconductor component and the light-receiving semiconductor component.

4. An optoelectronic coupling element according to claim 2, wherein the dimensions of the spacer particles determine the given distance between the light-emitting semiconductor component and the light-receiving semiconductor component.

5. A method for producing an optoelectronic coupling element, wherein the construction is performed in the steps of:

providing a lead-frame as a support and connecting medium, securing a first area chip to the connecting medium by bonding thereon, providing a transparent coupling medium including transparent spacers, and fastening a second area chip directly on the first area chip using the transparent coupling medium wherein at least two the transparent spacers are located between the first area chip and the second area chip.

6. A method according to claim 5, further comprising the step of coating the arrangement in an envelope of a non-transparent but reflecting medium.

7. A method according to claim 5, further comprising the step of selecting the first area chip to be larger than the second area chip.

8. A method according to claim 5, wherein the first area chip is selected to be responsive to light and the second area chip is selected to provide light emission to which the first area chip responds.

* * * * *